(12) United States Patent
Krasowski

(10) Patent No.: US 8,416,007 B1
(45) Date of Patent: Apr. 9, 2013

(54) N CHANNEL JFET BASED DIGITAL LOGIC GATE STRUCTURE

(75) Inventor: Michael J Krasowski, Chagrin Falls, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 189 days.

(21) Appl. No.: 13/098,918

(22) Filed: May 2, 2011

(51) Int. Cl.
*H03K 17/687* (2006.01)

(52) U.S. Cl.
USPC ............ 327/430; 327/437; 327/427; 327/108

(58) Field of Classification Search .................. 327/108, 327/430, 427
See application file for complete search history.

(56) References Cited

U.S. PATENT DOCUMENTS

| | | | | |
|---|---|---|---|---|
| 4,301,421 A | * | 11/1981 | Yokoyama | 330/253 |
| 5,751,181 A | * | 5/1998 | Maemura et al. | 327/434 |
| 7,688,117 B1 | * | 3/2010 | Krasowski | 326/112 |
| 7,940,122 B2 | * | 5/2011 | Satou | 330/282 |
| 2007/0176692 A1 | * | 8/2007 | Chen | 331/16 |
| 2009/0066418 A1 | * | 3/2009 | Satou | 330/277 |

\* cited by examiner

*Primary Examiner* — Ryan Jager
(74) *Attorney, Agent, or Firm* — Robert H. Earp, III

(57) ABSTRACT

An apparatus is provided that includes a first field effect transistor with a source tied to zero volts and a drain tied to voltage drain drain (Vdd) through a first resistor. The apparatus also includes a first node configured to tie a second resistor to a third resistor and connect to an input of a gate of the first field effect transistor in order for the first field effect transistor to receive a signal. The apparatus also includes a second field effect transistor configured as a unity gain buffer having a drain tied to Vdd and an uncommitted source.

13 Claims, 5 Drawing Sheets

US 8,416,007 B1

N CHANNEL JFET BASED DIGITAL LOGIC GATE STRUCTURE

ORIGIN OF THE INVENTION

The invention described herein was made by an employee of the United States Government and may be manufactured and used by or for the Government for Government purposes without the payment of any royalties thereon or therefore.

FIELD

The present invention relates to a circuit topography, and, more particularly, to circuit topography used to create digital logic gates having an N channel Junction Field Effect Transistor (JFET), load resistors, level shifting resistors, and supply rails whose values are based on the direct current parametric distributions of those JFETs.

BACKGROUND

There are logic gate structures that can operate at temperatures up to and exceeding 500 degrees Celsius. For complex (or large) multiplexer array functions, for example, in memories, a relatively large amount of substrate real estate is taken up. The current problem is how to more efficiently configure silicon carbide (SiC) multiplexor circuits such that less components are utilized, making the real estate available for other circuit functions, such as more memory bits or more decoding.

SUMMARY

Certain embodiments of the present invention may provide solutions to the problems and needs in the art that have not yet been fully identified, appreciated, or solved by current digital logic gates.

One embodiment of the present invention pertains to an apparatus that includes a first field effect transistor, a first node, and a second field effect transistor. The first field effect transistor has a source tied to zero volts and a drain tied to voltage drain drain (Vdd) through a first resistor. The first node is configured to tie a second resistor to a third resistor and connect to an input of a gate of the first field effect transistor such that the first field effect transistor can receive a signal. The second field effect transistor is configured as a unity gain buffer having a drain tied to Vdd and an uncommitted source.

In another embodiment of the present invention, a method is provided that includes tying a source of a first field effect transistor to zero volts and a drain of the first field effect transistor to voltage drain drain (Vdd) through a first resistor. The method also includes tying, at a first node, a second resistor to a third resistor and connecting the first node to an input of a gate of the first field effect transistor such that the first field effect transistor can receive a signal. The method further includes tying a drain of a second field effect transistor to Vdd with a source of the second field effect transistor being an uncommitted source

BRIEF DESCRIPTION OF THE DRAWINGS

For a proper understanding of the invention, reference should be made to the accompanying figures. These figures depict only some embodiments of the invention and are not limiting of the scope of the invention. Regarding the figures.

DETAILED DESCRIPTION OF THE EMBODIMENTS

It will be readily understood that the components of the present invention, as generally described and illustrated in the figures herein, may be arranged and designed in a wide variety of different configurations. Thus, the following detailed description of the embodiments of an apparatus, a system, a method, and a computer readable medium, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Embodiments of the present invention provide a circuit topography, which is used to create usable digital logic gates using N (negatively doped) channel Junction Field Effect Transistors (JFETs) and load resistors, level shifting resistors, and supply rails whose values are based on the direct current (DC) parametric distributions of those JFETs. This method has direct application to the current state of the art in high temperature (300° Celsius to 500° Celsius and higher) silicon carbide (SiC) device production. The embodiments described herein pertain to an adaptation to a logic gate by removing a level shifter from the output of the gate structure, and applying it to the input of the same gate, thereby creating a source coupled gate topography. This structure allows for the construction of AND/OR (sum of products) arrays which use far fewer transistors and resistors than the same array as constructed from current gates. This is important when large multiplexer constructs are necessary as, for example, in the construction of memories.

Source coupling refers to the fact that the output of a drive gate, i.e., the source node on the JFET, couples to the input(s) of the circuits to be driven. This configuration allows for a savings in transistors and resistors by replacing logic OR configurations with wire OR configurations. Further, as described below, by placing a single path to ground, power is saved and the device operates more efficiently.

Figure 1:
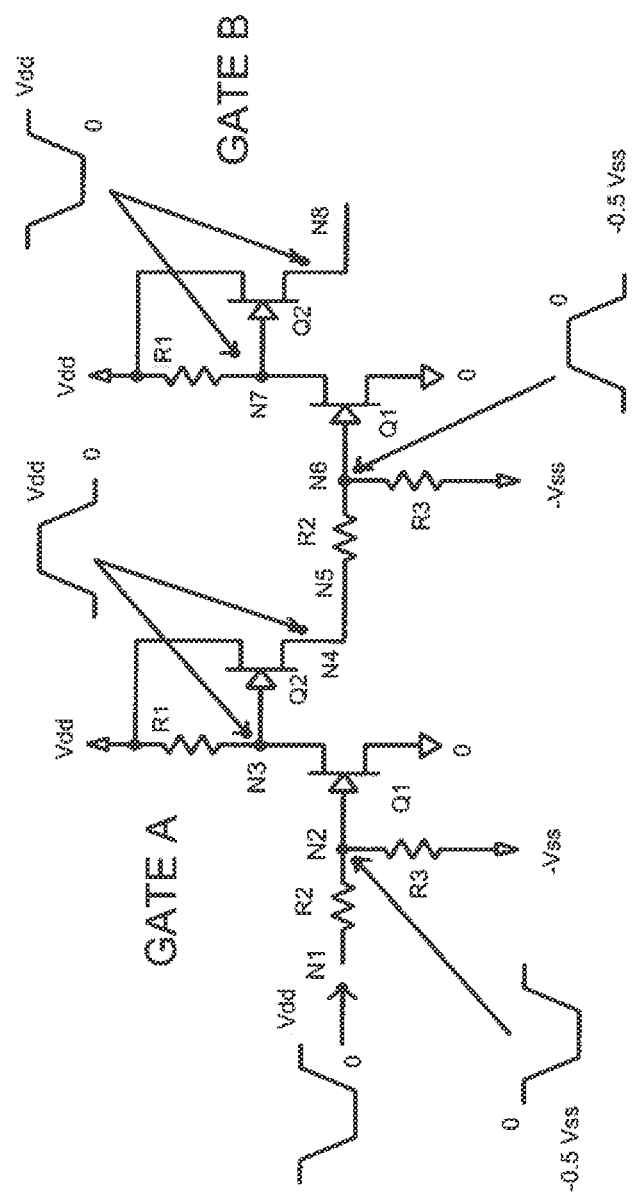
FIG. 1 illustrates an inverter, in accordance with an embodiment of the present invention.

Moreover, due to the variability in SiC device parameters, a logic gate circuit design was developed to allow logic gates to be constructed using expitaxial resistors and N Channel JFETs. The voltages are a function of the transistor turn-off voltage. That is: Vdd=2×(|Vgs(off)MAX|), Vss=−Vdd. Resistor values, as illustrated in FIG. 1, follow the general rule that R2=R3. R1 may equal R2 and R3 as necessary, though what is universally necessary is that R1>>rds(on) [on resistance from drain to source] for Q1, yet R1<<rds(off) [off resistance from drain to source] for Q1. (R2+R3)>>rds(on) [on resistance from drain to source] for Q2, yet (R2+R3) <<rds(off) [off resistance from drain to source] for Q2 of the logic gate driving the input of this gate, "input of this gate" defined as the series combination of R2 and R3.

FIG. 1 illustrates an inverter 100, in accordance with an embodiment of the present invention. The inverter 100 shown in FIG. 1, which has a source coupled logic (SCL) configuration, shows two gates, Gate A and Gate B. Gate A includes two field effect transistors or N (negatively doped) channel JFETs Q1 and Q2, four nodes N1, N2, N3, N4, and three resistors R1, R2, R3. Gate B also includes two field effect transistors or N (negatively doped) channel JFETs Q1 and Q2, four nodes N5, N6, N7, N8, and three resistors R1, R2, R3.

For Gate A, node N1 can be considered to be external to the gate and node N2 can be considered to be internal to the node. Node N1 is configured to receive a signal (or logic levels) anywhere from 0 to voltage drain drain (Vdd). Node N2 is configured to tie resistors R2 and R3. Resistors R2 and R3, which can be considered to be input level shifters, are configured to perform level shifts from 0 to −0.5 Vss (voltage source source). In this embodiment, Vdd is equal to negative Vss (Vdd=−Vss).

The input gate of field effect transistor Q1 is tied to node N2. The source of field effect transistor Q1 is tied to ground or 0 volts and the drain of field effect transistor Q1 is tied to Vdd through resistor R1. Node N3, which can have logic levels anywhere from Vdd to 0 volts, is configured to connect or tie field effect transistor Q1 to the input gate of field effect transistor Q2. Node N4 has similar logic levels. A person of ordinary skill in the art will readily appreciate that field effect transistor Q2 is configured to act as a buffering transistor so the effect of field effect transistor Q1 and resistor R1 are not seen by the output circuitry. The source of field effect transistor Q2 is connected through node N4 to node N5. Node N5 can be considered to be external to Gate B.

In this embodiment, Gate B includes a similar configuration as Gate A. For instance, node N6, which can have logic levels anywhere from 0 to −0.5 volts, is configured to tied resistors R2 and R3, and connect to the input gate of field effect transistor Q1. Field effect transistor has a source tied to ground and a drain tied to Vdd through resistor R1.

Node N7 has a logic level anywhere from 0 to Vdd and is configured to tie the output of field effect transistor Q1 to the input gate of field effect transistor Q2. The drain of field effect transistor Q2 is tied to Vdd and the source of field effect transistor Q2 is an uncommitted source through node N8. Node N8 is similar to node N7 in that node N8 has logic levels from 0 to Vdd. By having an uncommitted source terminal, the source of field effect transistor Q2 can be tied to another field effect transistor, a motor, and a pair of resistors as discussed in the different embodiments below.

It should be appreciated that if the characteristics of field effect transistors Q1 and Q2 are the same, then resistors R1, R2, and R3 are equal. In the alternative, if the characteristics of field effect transistors Q1 and Q2 are different, then resistors R2 and R3 are equal. It should be appreciated that the resistance of resistors R2 and R3 can be greater than the on resistance of field effect transistor Q2 and the resistance of resistor R1 can be greater than the on resistance of field effect transistor Q1. For instance, the resistance drain to source (RDS) on for resistor R1 is greater than the RDS on for field effect transistor Q1 and, for resistors R2=R3, the RDS on for resistor R2 is greater than the RDS on for field effect transistor Q2.

Because field effect transistor Q1 is an inverter and resistor R1 is a level shifter, an inversion and a level shift up to Vdd are performed. Since field effect transistor Q1 and resistor R1 are configured to perform an inversion and a level shift up, there has to be a level shift down at the output. By tying the output of resistors R2 and R3 to −Vss, a level shift down can occur and by configuring R2 and R3 to be equal, Vss/2 or (−0.5 Vss) can be realized.

At node N1, with an input signal at Vdd, resistors R2 and R3 are configured to perform a level shift up and a divide by 2, which results in the voltage at node N2 to be at 0 volts. This causes the gate and the source of field effect transistor Q1 to be at 0 volts. When the gate and source of field effect transistor Q1 are at 0 volts or the same potential, then field effect transistor Q1 is fully on. When field effect transistor Q1 is fully on, the source and the drain on are shorted together and separated by RDS on. This means that the drain is at 0 volts, because resistor R1 is greater than RDS on for field effect transistor Q1. As a result, current flows through resistor R1.

Because node N3 is equal to the source voltage of field effect transistor Q1, node N3 is about 0 volts. Field effect transistor Q2 is a source follower, i.e., a buffer, and is configured to receive the voltage from node N3 and apply a suitable load, causing the voltage at the gate of field effect transistor Q2 to be equal to the source of the field effect transistor Q2. This causes node N4 to be at Vdd as well.

However, at node N1, when the input signal is at 0 volts, resistors R2 and R3 are configured to perform level shifting and a division by 2, thereby resulting in −0.5 Vss. In this embodiment, ½ of Vss is at or exceeds the turn off voltage (voltage gate to source off) for field effect transistor Q1. In other words, −0.5 Vss is sufficient to turn field effect transistor Q1 off. If field effect transistor Q1 is off, then RDS on for field effect transistor Q1 is greater than the value of resistor R1, causing node N3 to be at Vdd. By applying Vdd of node N3 to the gate of Q2, node N4 will also be at Vdd.

The embodiment described above and shown in FIG. 1 illustrates open transistor logic structures (emitter coupled logic, open collector logic, source coupled logic, etc.) that allow for certain economies and extra capabilities beyond that of direct coupled structures. For instance, examples of these economies can be realized through the example of wire OR-ing of signals (or wire AND-ing), i.e., where multiple outputs without having to use a separate input for each of those outputs at another gate dedicated to perform the OR-ing (or AND-ing). This is illustrated in FIG. 2 as described below.

Figure 2:
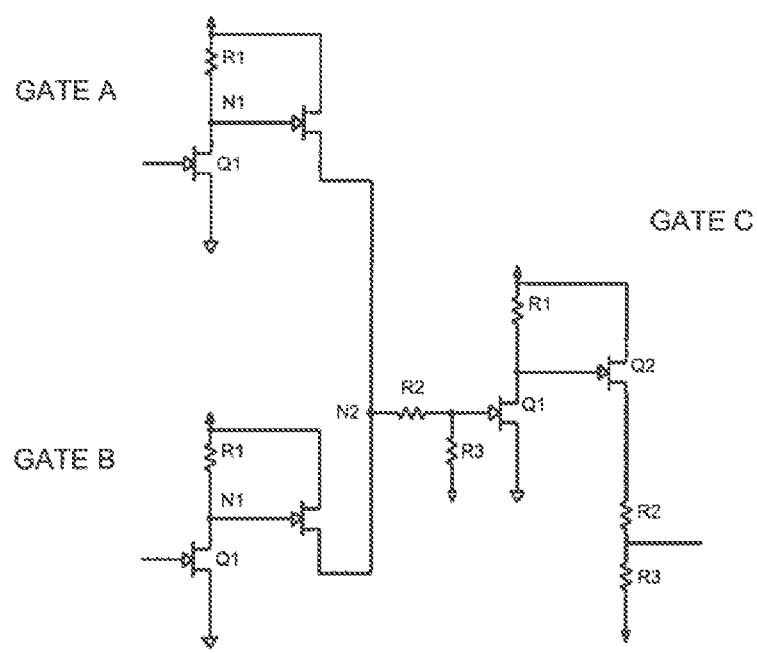
FIG. 2 illustrates an inverter, in accordance with another embodiment of the present invention

FIG. 2 illustrates an inverter 200, in accordance with another embodiment of the present invention. The circuitry shown in FIG. 2 includes a similar configuration to FIG. 1. For instance, Gates A and B include a field effect transistor Q1 having a source tied to ground and a drain tied to Vdd through resistor R1. In Gates A and B, field effect transistors Q1 and Q2 are tied together by node N1. The drain of Q2 is tied to Vdd. The source of Q2 in Gates A and B is connected to node N2 such that a signal can be OR-ed at N2. It should be appreciated that multiples connections can be made to node N2.

For Gate C, resistors R2 and R3 can be tied by node N3, which connects to the input gate of field effect transistor Q1. Field effect transistor Q1 also includes a source being tied to ground and a drain tied to Vdd through resistor R1. Node N4 connects the output gate of field effect transistor Q1 to the input gate of field effect transistor Q2. The drain of field effect transistor Q2 is connected to Vdd and the source, which can be an uncommitted source, is tied to a series combination of resistors R2 and R3. Similar to the embodiments discussed above, resistors R2 and R3 are equal and Vdd equals negative Vss.

It should be appreciated that the OR-ing is occurring at the input, but the output is then being inverted, thus causing a NOR-ing function to be applied to the signal. For instance, the OR-ing occurs between the outputs of the two sources of the field effect transistor Q2 and the resistors R2, R3 of field effect transistor Q1. The signal is then inverted by field effect transistor Q2 and resistors R2, R3 in Gate C to cause a NOR-ing function to be applied.

In the embodiment shown in FIG. 2, if the output of Gate A is 1, true or high and the output of Gate B is 0, false, or low, then the output of Gate C is low. If the output of Gate B is 1, true or high and the output of Gate A is 0, false, or low, then the output of Gate C is low. If both outputs of Gate A and B are high, 1, or true, then the output of Gate C is low. If both outputs of Gate A and B are low, false or 0, then the output of Gate C is high.

In Gate A, if the gate of field effect transistor Q2 is at Vdd, then the source is also at Vdd. In Gate B, if the gate of field effect transistor Q2 is at 0 volts, then the output of Q2 is high. This causes the resistors R2 and R3 in Gate C to receive the high output from Q2. This allows the inverter to be a NAND and/or a NOR.

Figure 3:
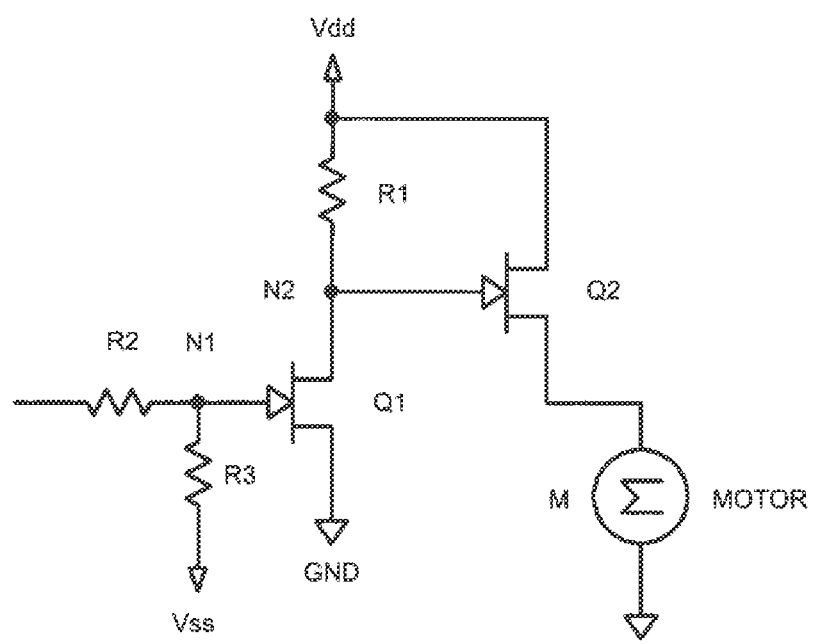
FIG. 3 illustrates an inverter, in accordance with another embodiment of the present invention.

The embodiment shown in FIG. 3 allows for savings in components to be realized, thereby freeing up space on a die or circuit board and, further, a power savings has been realized as less components are being utilized. The embodiment shown in FIG. 3 also allows for more than two inputs, i.e., inputs at Gates A and B, such that multiple inputs can be added with the outputs of the Gates being tied to node N2, causing each signal to be OR-ed.

A benefit of having an uncommitted source is that the uncommitted output from the gate can be used to drive a component able to accept such a signal. For instance, the output may be used to drive electromechanical devices, other drivers such as power devices, or any device that will be appreciated by a person of ordinary skill in the art. For instance, FIG. 3 described below shows such a device driving a motor.

FIG. 3 illustrates an inverter 300, in accordance with another embodiment of the present invention. Inverter 300 shown in FIG. 3 uses an open transistor output as a logic gate, and includes a similar configuration as FIG. 1. For instance, Node N1 is configured to tie resistors R2 and R3 together, resistors R2 and R3 being equal. Node N1 also connects with the input gate of field effect transistor Q1. Field effect transistor Q1 has a source tied to ground and a drain tied to Vdd through resistor R1. Node N2 is configured to tie the output of field effect transistor Q1 with the input gate of field effect transistor Q2. The drain of field effect transistor Q2 is tied to Vdd and the source of field effect transistor Q2 is tied to a positive terminal of a motor M. The negative terminal of motor M is tied to ground. It should be appreciated that the source of field effect transistor Q2 is not limited to being tied to a motor or a mechanical device, but can be tied to the input of another gate or to a series of resistors, or any other configuration as would be appreciated by a person of ordinary skill in the art.

In this embodiment, if the input of the gate is provided a signal such that the voltage at the gate of field effect transistor Q2 is 0 volts (which means a high came into the gate), then there will be 0 volts at the source. However, if the input of the gate is provided a signal such that the voltage at the gate of field effect transistor Q2 is Vdd, then Vdd is also at the source of the transistor, causing the motor to turn as Vdd is being applied to the motor.

Figure 4:
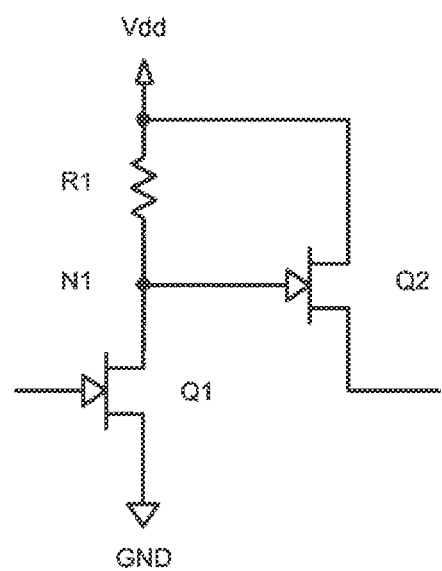
FIG. 4 illustrates an inverter, in accordance with another embodiment of the present invention.

FIG. 4 illustrates an inverter 400, in accordance with another embodiment of the present invention. For instance, FIG. 4 illustrates a logic gate that can accept direct coupled logic inputs, but has a source coupled logic output. In other words, the logic gate shown in FIG. 4 is a translator from source coupled logic to direct coupled logic.

In this embodiment, the input gate of a first field effect transistor Q1 is open. The source of field effect transistor Q1 is tied to ground and the drain is tied to Vdd through R1. Node N1 is configured to tie the output of field effect transistor Q1 with the input gate of a second field effect transistor Q2. The drain of field effect transistor Q2 is tied to Vdd and the source is an uncommitted source terminal, such that the source can be tied to a series of resistors, an input gate of another field effect transistor, or a mechanical device.

Figure 5:
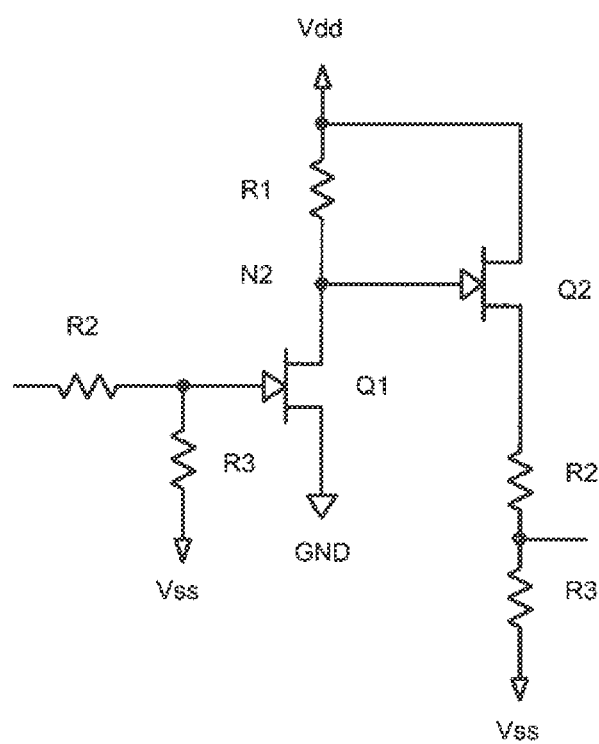
FIG. 5 illustrates an inverter, in accordance with another embodiment of the present invention

FIG. 5 illustrates an inverter 500, in accordance with another embodiment of the present invention. In particular, FIG. 5 illustrates a logic gate that can accept source coupled logic inputs, but has a direct coupled logic output. In other words, the logic gate shown in FIG. 5 is a translator from source coupled logic to a direct coupled logic.

In this embodiment, node N1 is configured to tie resistors R2 and R3 together and also connect with the input gate of field effect transistor Q1. The source of field effect transistor Q1 is tied to ground and the drain is tied to Vdd through R1. Node N2 is configured to tie the output of field effect transistor Q1 with the input gate of field effect transistor Q2. The drain of field effect transistor Q2 is tied to Vdd and the source is tied to a series of resistors. However, it should be appreciated that the source can be tied to an input gate of another field effect transistor, a mechanical device, or any other configuration that would be appreciated by a person of ordinary skill in the art.

Embodiments of the present invention differ from previous SiC logic designs in that the embodiments of the present invention allows for far fewer components to be used, and thus space is saved over conventional designs. In this manner, large multiplexing functions, or large sum of products functions can have a more efficient OR (sum) function implemented. The transistors and resistors saved can be used elsewhere to add more features to the integrated circuit. Also, with a reduction in the amount of level shifters being utilized, power dissipation in the device goes down as one path to ground replaces many paths.

Also, there is enormous commercial potential for high temperature, high radiation hard logic devices. For example, oscillators using resistive and capacitive sensors as time based components and built around SiC logic gates would be a useful point of source digitizers of sensed variables in a high temperature environment such as a jet engine, near a hydrothermal vent, at a drill head in deep hole environments, etc. Using the output of the oscillator to drive a SiC binary polynomial generator unique to that sensor while also modulating the output of the oscillator by the polynomial prior to transmitting the polynomial on a wire or over air will give that sensor a unique signature. Multiple sensors transmitting on the same medium can then be singled out through source separation algorithms.

State machines can also be built out of SiC logic devices, giving processing capability to devices, both fixed and mobile, operating in high temperature environments. An example would be a robot operating on the surface of Venus, with expected temperatures up to 460° C. A state machine built out of SiC logic could direct the vehicle as it avoids obstacles, deploys sensors, transmits telemetry to other devices, etc. Given the added radiation hardness of SiC, robots could be made to enter nuclear power plants during and after a meltdown for mitigation or clean up. The extreme temperatures and radiation fluence could be tolerated by a SiC-based robot. Analog functions such as amplifiers, summers, integrators, differentiators, etc., can also be configured from the basic inverter structure.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. An apparatus, comprising:
   a first field effect transistor with a source tied to zero volts and a drain tied to voltage drain drain (Vdd) through a first resistor;
   a first node configured to tie a second resistor to a third resistor and connect to an input of a gate of the first field effect transistor in order for the first field effect transistor to receive a signal;
   a second field effect transistor configured as a unity gain buffer having a drain tied to Vdd and an uncommitted source; and
   wherein the third resistor is tied to a negative voltage source (Vss), and the negative Vss is equal to Vdd.

2. The apparatus of claim 1, wherein the uncommitted source is tied to an input of a gate of another field effect transistor through a pair of resistors.

3. The apparatus of claim 1, wherein the uncommitted source is tied to a mechanical device.

4. The apparatus of claim 1, wherein the uncommitted source is tied to negative Vss through a pair of resistors.

5. The apparatus of claim 1, wherein, when the first and the second field effect transistors have different characteristics, the second and third resistors are equal, the first and second resistor are unequal, and the first and third resistors are unequal.

6. The apparatus of claim 1, wherein, when the first and the second field effect transistors have similar characteristics, the first, the second and the third resistors are equal.

7. The apparatus of claim 1, further comprising:
   a second node configured to tie an output of the first field effect transistor with an input gate of the second field effect transistor.

8. A method, comprising:
   tying a source of a first field effect transmitter to zero volts and a drain of the first field effect transmitter to voltage drain drain (Vdd) through a first resistor;
   tying, at a first node, a second resistor to a third resistor and connecting the first node to an input of a gate of the first field effect transistor in order for the first field effect transistor to receive a signal;
   tying a drain of a second field effect transistor to Vdd with a source of the second field effect transmitter being an uncommitted source; and
   wherein the third resistor is tied to negative voltage source source (Vss), and the negative Vss is equal to Vdd.

9. The method of claim 8, further comprising:
   tying the uncommitted source to an input of a gate of another field effect transistor through a pair of resistors.

10. The method of claim 8, further comprising:
    tying the uncommitted source to a mechanical device.

11. The method of claim 8, further comprising:
    tying the uncommitted source to negative Vss through a pair of resistors.

12. The method of claim 8, wherein, when the first and the second field effect transistors have different characteristics, the second and third resistors are equal, the first and second resistor are unequal, and the first and third resistors are unequal.

13. The method of claim 8, wherein, when the first and the second field effect transistors have similar characteristics, the first, the second and the third resistors are equal.

* * * * *